United States Patent
Wang

(10) Patent No.: US 12,293,987 B2
(45) Date of Patent: May 6, 2025

(54) ELECTRONIC PACKAGE DEVICE AND METHOD OF OPERATING THE SAME

(71) Applicant: Realtek Semiconductor Corporation, Hsinchu (TW)

(72) Inventor: Chih-Chiang Wang, Hsinchu (TW)

(73) Assignee: Realtek Semiconductor Corporation, Hsinchu (TW)

( * ) Notice: Subject to any disclaimer, the term of this patent is extended or adjusted under 35 U.S.C. 154(b) by 233 days.

(21) Appl. No.: 18/171,387

(22) Filed: Feb. 20, 2023

(65) Prior Publication Data
US 2023/0299046 A1    Sep. 21, 2023

(30) Foreign Application Priority Data
Mar. 17, 2022 (TW) ................. 111109952

(51) Int. Cl.
*H01L 25/065* (2023.01)
*H01L 23/00* (2006.01)
*H03M 1/06* (2006.01)

(52) U.S. Cl.
CPC .......... *H01L 25/0655* (2013.01); *H01L 24/48* (2013.01); *H03M 1/0626* (2013.01); *H01L 2224/48137* (2013.01); *H01L 2924/142* (2013.01); *H01L 2924/14253* (2013.01); *H01L 2924/1426* (2013.01); *H01L 2924/3025* (2013.01)

(58) Field of Classification Search
CPC ............... H03M 1/0626; H03M 1/0827
See application file for complete search history.

(56) References Cited

U.S. PATENT DOCUMENTS

| | | | | |
|---|---|---|---|---|
| 3,845,412 A * | 10/1974 | Rearwin | ............... | H04L 27/364 332/185 |
| 4,969,163 A * | 11/1990 | Ungerboeck | ......... | H04L 7/0278 375/354 |
| 6,313,772 B1 * | 11/2001 | McNeely | ................ | H04L 27/02 348/724 |
| 7,461,295 B1 * | 12/2008 | Iyengar | .............. | G01R 31/3016 714/25 |
| 8,604,962 B1 * | 12/2013 | Lewyn | ............... | H03M 1/0863 341/161 |
| 8,975,752 B2 * | 3/2015 | Chow | ..................... | H01L 24/06 257/692 |
| 11,133,280 B2 * | 9/2021 | Lin | ........................ | H01L 24/45 |
| 11,309,869 B1 * | 4/2022 | Deng | ...................... | H03B 5/02 |
| 2009/0195308 A1 * | 8/2009 | Lin | ...................... | H03G 3/3026 330/136 |

(Continued)

FOREIGN PATENT DOCUMENTS

TW           201001926 A      1/2010

*Primary Examiner* — Lam T Mai
(74) *Attorney, Agent, or Firm* — CKC & Partners Co., LLC

(57) ABSTRACT

An electric package device is provided, including a first chip and a second chip. The first chip includes a first conductive pad. The second chip includes a second conductive pad. The second conductive pad couples to the first conductive pad through a connection wire. In some embodiments, the first chip includes a first signal control circuit that receives, in response to a selection signal, one of multiple input signals as a first signal, filters the first signal, and outputs the filtered first signal, as a second signal, from the first conductive pad to the second conductive pad.

17 Claims, 4 Drawing Sheets

(56) References Cited

U.S. PATENT DOCUMENTS

| | | | |
|---|---|---|---|
| 2009/0326692 A1* | 12/2009 | Lin | H03M 1/1215 |
| | | | 341/144 |
| 2010/0318815 A1* | 12/2010 | Hu | G06F 1/26 |
| | | | 713/300 |
| 2013/0156226 A1* | 6/2013 | Huang | H03G 3/301 |
| | | | 330/127 |
| 2014/0167292 A1* | 6/2014 | Masumura | H01L 24/48 |
| | | | 257/784 |
| 2016/0315598 A1* | 10/2016 | Min | H03K 5/1252 |
| 2019/0207789 A1* | 7/2019 | Kim | H03K 5/007 |
| 2020/0241665 A1* | 7/2020 | Fu | G06F 3/04166 |
| 2021/0126626 A1* | 4/2021 | Chen | H03H 11/1286 |
| 2021/0143861 A1* | 5/2021 | Lee | H03H 19/002 |
| 2021/0203372 A1* | 7/2021 | Yoshida | H04B 1/40 |
| 2023/0118711 A1* | 4/2023 | Lee | H01L 23/49816 |
| | | | 257/659 |
| 2023/0215822 A1* | 7/2023 | Hsieh | H01L 23/367 |
| | | | 330/307 |
| 2024/0128980 A1* | 4/2024 | Liang | H03M 1/1245 |

* cited by examiner

ELECTRONIC PACKAGE DEVICE AND METHOD OF OPERATING THE SAME

RELATED APPLICATIONS

This application claims priority to Taiwanese Application Ser. No. 111109952, filed Mar. 17, 2022, which is herein incorporated by reference.

BACKGROUND

Technical Field

The present application relates to an electronic package device and a method of operating the same. More particularly, the present application relates to the electronic package device, which includes a connection wire between two chips, and a method of operating the same.

Description of Related Art

As multi-chip modules (MCM) are prevailing, reduction of signal noise induced by connection elements (wires, pads, etc.,) in signal transmission paths between chips has become a pivotal issue. For instance, due to the high-frequency components of stair-step signals included in some output signals of digital-to-analog converters, the output signals often interact with the connection elements in the transmission path during the transmission process, which results in degraded total harmonic distortion (THD) of the signal in the package module.

SUMMARY

Some aspects of the present application are to provide an electronic package device that includes a first chip and a second chip. The first chip has a first conductive pad. The second chip has a second conductive pad and is coupled to the first conductive pad through a connection wire. In some embodiments, the first chip includes a first signal control circuit configured to receive, in response to a selection signal, one of a plurality of input signals as a first signal, filter the first signal, and output the filtered first signal as a second signal from the first conductive pad to the second conductive pad.

Some aspects of the present application are to provide a method of operating an electronic package device, and the method includes operations below: receiving, by a multiplexer, in response to a selection signal, one of multiple input signals as a first signal; filtering, by a first filter circuit, the first signal, and amplifying, based on a first gain value, the first signal to output a second signal; and filtering, by a second filter circuit different from the first filter circuit, the second signal received from a connection wire to output a third signal to a driver circuit.

Some aspects of the present application are to provide an integrated circuit that includes a first chip and a second chip. The first chip includes a first signal control circuit configured to selectively amplify, based on a first gain value, one of multiple input signals to output a first signal. The second chip includes a second signal control circuit and coupled to the first signal control circuit. The second signal control circuit is configured to perform low-pass filtering on the first signal and to amplify, based on a second gain value different from the first gain value, the first signal to output a second signal to a driver circuit.

BRIEF DESCRIPTION OF THE DRAWINGS

The disclosure can be more fully understood by reading the following detailed description of the embodiment, with reference made to the accompanying drawings as follows.

DETAILED DESCRIPTION

In the present application, "connected" or "coupled" may refer to "electrically connected" or "electrically coupled." "Connected" or "coupled" may also refer to operations or actions between two or more elements.

Figure 1:
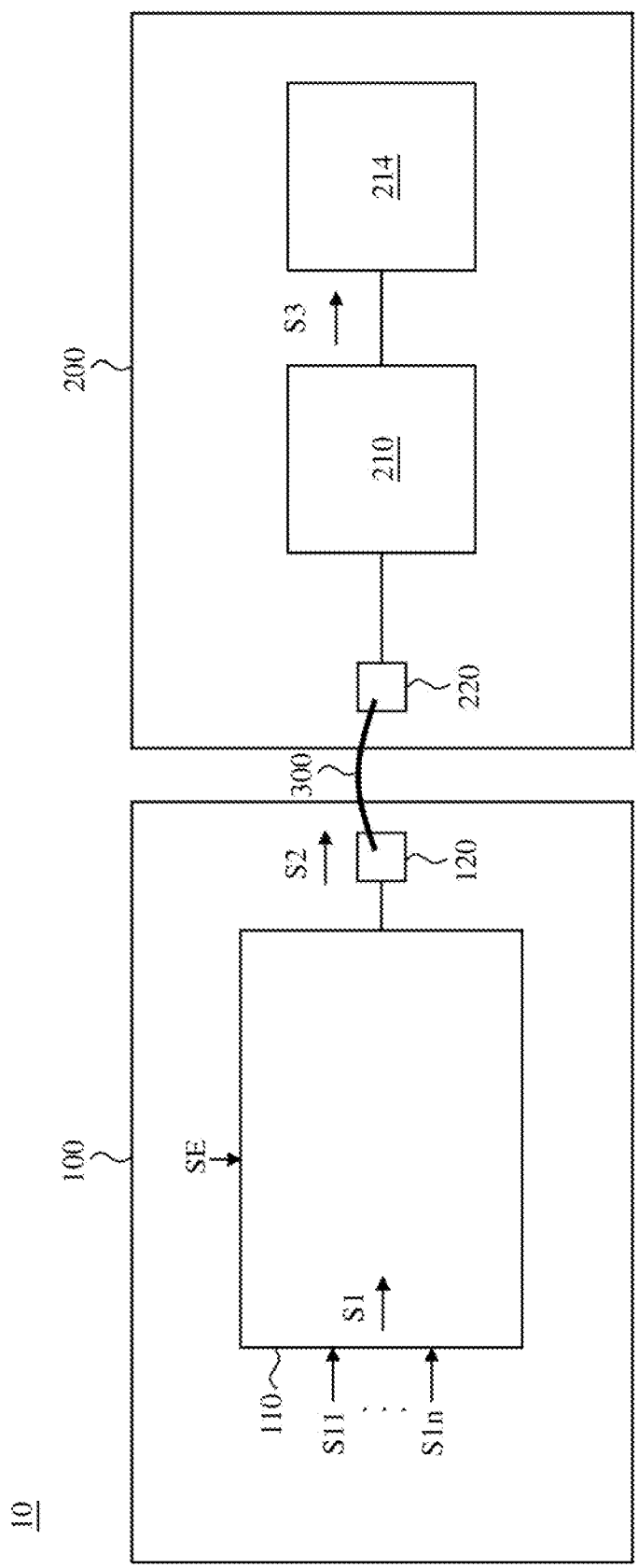
FIG. 1 is a schematic diagram of an electric package device, according to some embodiments of the present application.

Reference is now made to FIG. 1. FIG. 1 is a schematic diagram of an electric packaging device 10, according to some embodiments of the present application. As shown in FIG. 1, the electric packaging device 10 includes a chip 100 and a chip 200. The chip 100 and the chip 200 have a conductive pad 120 and a conductive pad 220 respectively, in which the conductive pad 120 is coupled to the conductive pad 220 through a connection wire 300. In some embodiments, the conductive pads are bonding pads, and the connection wire 300 is a bonding wire.

For illustration, the chip 100 in FIG. 1 includes a signal control circuit 110. An output terminal of the signal control circuit 110 is coupled to the conductive pad 120. In some embodiments, the signal control circuit 110 is configured to receive n input signals S11-S1N, select, in response to a selection signal SE, one of the input signals S11-S1N as a signal S1, filter the signal S1, and to output the filtered signal S1 as a signal S2 from the conductive pad 120 to the conductive pad 220.

With continued reference to the embodiments above, the chip 200 receives the signal S2 from the chip 100 through the connection wire 300 and the conductive pad 220. The chip 200 includes a signal control circuit 210 and a driver circuit 214. An input terminal of the signal control circuit 210 is coupled to the conductive pad 220. The signal control circuit 210 is configured to filter and/or amplify the signal S2 to generate the signal S3 to the driver circuit 214. In some embodiments, the signal control circuit 210 operates as a filter circuit. The driver circuit 214 is configured to drive an audio device (not shown) outside the chip 200 according to the signal S3.

In some embodiments, the signal control circuit 110 is further configured to amplify, based on the gain value G1, the signal S1 to generate the signal S2, and the signal control circuit 210 is further configured to amplify, based on the gain value G2, the signal S2 to generate the signal S3. Alternatively stated, by the signal control circuit 110 and the signal control circuit 210, the signal S3 is generated by amplifying the signal S1 according to a gain value (G1×G2). In some embodiments, the gain value (G1×G2) is assumed to be a constant value, and the gain value G1 is different from the gain value G2 and depends on the level of noise in the electronic components included the chips 100 and 200.

For instance, if the chip 100 has less electronic component noise on its signal transmission path than that in the chip 200 due to its manufacturing process and/or the configuration of its internal electronic components, accordingly, in the embodiment above, the gain value G1 is greater than the gain value G2. In contrast, in other embodiments, if the chip 200 has less electronic component noise on its signal transmission path than that in the chip 100 due to its manufacturing process and/or the configuration of its internal electronic components, accordingly in the embodiment above, the gain value G1 is smaller than the gain value G2. In the other different embodiments, the gain value G1 is equal to the gain value G2 according to the actual implementation of the present application.

In some applications in the field, in order to transmit multiple signals from one chip to the target chip, and for the target chip (e.g., the chip 200 in the present application) to select one of the signals for further processing, numerous sets of conductive pads are required to be arranged between the chips and multiple connection wires are utilized for signal transmission. In these applications, if the signal S1 contains some high-frequency components, the transmission noise caused by the interaction between the parasitic inductance and capacitance of the conductive pads and connection wires and the high-frequency components of the signal S1 will strongly affect the quality of the signal.

By applying configurations of the present application, before multiple signals are transmitted to the target chip, the signal required by the target chip is selected in the front-end chip, and the filter circuit in the front-end chip further eliminates high-frequency components of the signals before they reach the conductive pads and connection wires. Subsequently, the signal is transferred to the target chip through a signal connection wire. With the above configuration, in addition to reducing the transmission noise—the high-frequency components of the signal S1 have been filtered out before interacting with the parasitic capacitance and parasitic inductance—caused by transmission elements (such as conductive pads and connection wires, etc.), the number of transmission components across the chips can be decreased to reduce the area occupied by the transmission components in the electronic packaging device, thereby further saving the manufacturing cost of the electronic packaging device and improving the yield.

The configuration of FIG. 1 is provided for illustrative purposes. The various implementations of FIG. 1 are within the category of an embodiment of the present application. For example, in some embodiments, the chip 200 does not include the signal control circuit 210. In some embodiments, the driver circuit 214 is configured to drive, according to the signal S3, electronic devices other than audio devices.

Figure 2:
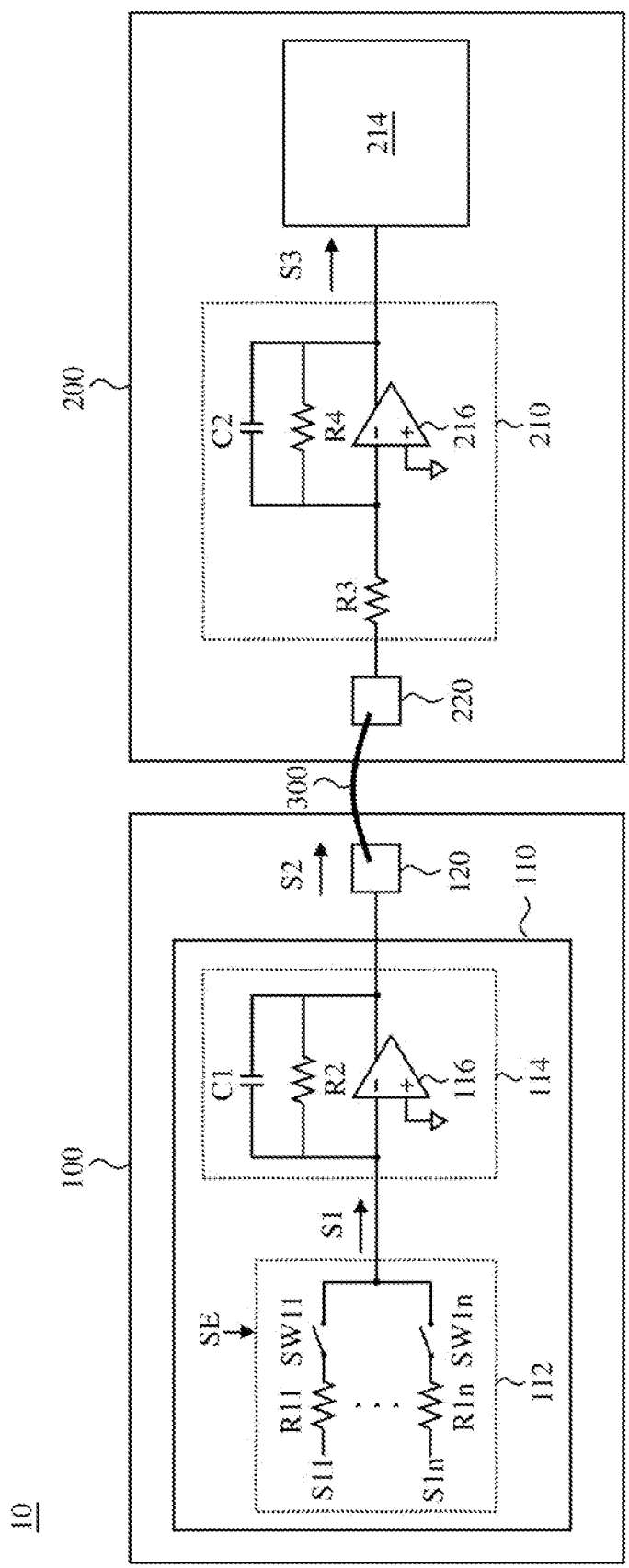
FIG. 2 is a detailed schematic diagram corresponding to the electronic packaging device in FIG. 1, according to some embodiments of the present application.

Reference is now made to FIG. 2. FIG. 2 is a detailed schematic diagram corresponding to the electronic packaging device 10 in FIG. 1, according to some embodiments of the present application. As shown in FIG. 2, the chip 100 includes a multiplexer 112 and a filter circuit 114 coupled between the multiplexer 112 and the conductive pad 120.

For illustration, the multiplexer 112 includes switches SW11-SW1$n$ and receives the input signals S11-S1$n$, in which several transmission paths of the input signals S11-S1$n$ to the switches SW11-SW1$n$ include resistors R11-R1$n$, and ratio of a resistor R2 to the resistors R11-R1$n$ defines the gain value G1 for each path. In some embodiments, the filter circuit 114 includes an amplifier 116, a resistor R2 and a capacitor C1 that are coupled in parallel between the output terminal of the multiplexer 112 and the output terminal of the filter circuit 114. In some embodiments, the gain value of the signal control circuit 110 is related to the ratio of the resistor R2 to the resistors R11-R1$n$. One input terminal (e.g., the negative input terminal) of the amplifier 116 is configured to receive the signal S1, and the other input terminal (e.g., the positive input terminal) is configured to be coupled to a ground terminal. An output terminal of the amplifier 116 is coupled to the resistor R2, the capacitor C1 and the conductive pad 120.

The signal control circuit 210 in the chip 200 includes an amplifier 216, a resistor R3 having one terminal coupled to the conductive pad 220, a resistor R4 and capacitor C2 that are coupled in parallel between the other terminal of the resistor R3 and the output terminal of the signal control circuit 210. In some embodiments, the gain value of the signal control circuit 210 is related to the ratio of the resistor R4 to the resistor R3. An input terminal (e.g., the negative input terminal) of the amplifier 216 is configured to receive the signal S2 from the conductive pad 220 through the resistor R3, and the other input terminal (e.g., the positive input terminal) is configured to be coupled to a ground terminal. An output terminal of the amplifier 216 is coupled to the resistor R4, the capacitor C2 and the driver circuit 214.

In some embodiments, the amplifiers 116 and 216 may be implemented as operational amplifiers or other suitable circuits for amplifying signals.

The configuration of FIG. 2 is presented for illustrative purposes. The various implementations of FIG. 2 are within the category of an embodiment of the present application. For example, in some embodiments, the configurations of the filter circuit 114 and the signal control circuit 210 are not limited to the example in FIG. 2, and the filter circuit 114 and the signal control circuit 210 in this case can be implemented with any suitable filter circuit.

Figure 3:
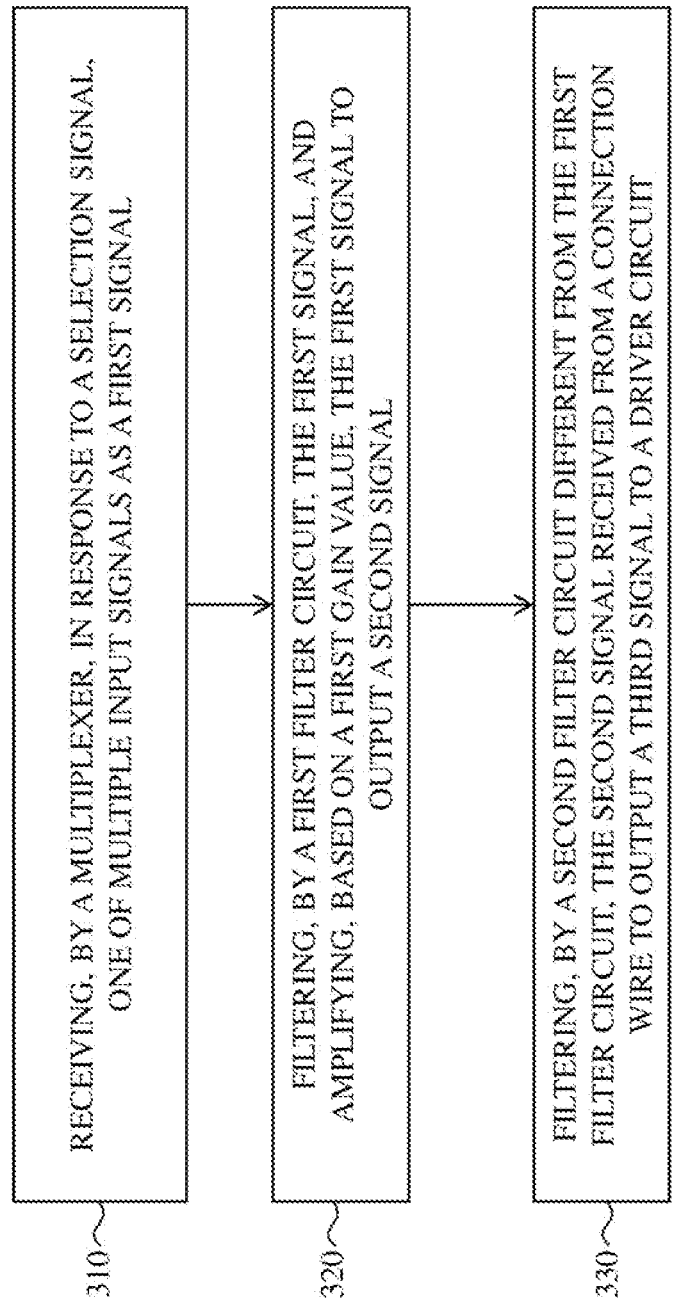
FIG. 3 is a flowchart of a method of operating an electronic packaging device, according to some embodiments of the present application.

In the coming section, the embodiments of the present application will be further described with reference to FIGS. 1-3. FIG. 3 is a flowchart of a method 30 of operating an electronic packaging device, according to some embodiments of the present application. It should be understood that additional operations may be provided before, during, and after the processes shown by FIG. 3, and that some of the operations described below may be replaced or eliminated for additional embodiments of the method. The order of these operations/processes may be interchangeable. Similar reference numbering is used to designate similar elements throughout the various views and the illustrative embodiments. The method 30 of operating an electronic packaging device includes the steps 310, 320, 330 described below with reference to the electronic packaging devices 10, 40 of FIGS. 1-4.

In step 310, one of the input signals S11-S1$n$ is received as the signal S1 through the multiplexer 112 in response to the selection signal SE. For example, one of the switches SW11-SW1$n$ (e.g., the switch SW11) is turned on according to the selection signal SE, and the other switches SW12-SW1$n$ are turned off. The input signal S11 is output from the multiplexer 112 through the resistor R11 and the switch SW11 as the input signal 51 to the input terminal of the amplifier 116, and the input terminal is coupled to the resistor R2 and the capacitor C1. In some embodiments, the input signal S11 has a voltage swing VS1. For instance, the voltage swing VS1 of the input signal S11 is between −1.8 Volts and +1.8 Volts.

In step 320, the filter circuit 114 filters the input signal S11 and amplifies the input signal S11 according to the gain value G1 to output the signal S2. As illustratively shown in FIG. 2, the capacitor C1 and the resistor R2 are configured to filter the signal S1 (coming from input signal S11), and the resistor R2, the resistor R11 and the amplifier 116 are configured to amplify the input signal S11. In some embodiments, the gain value G1 is approximately equal to 1.83, so the voltage swing VS2 of the signal S2 is between −3.3 Volts and +3.3 Volts volt (i.e., the voltage swing VS1*the gain value G1).

In some embodiments, filtering the signal S1 (coming from the input signal S11) with the filtering circuit 114 includes operations of low-pass filtering. For example, the filter circuit 114 passes (outputs) the signal components, in the input signal S11, having frequencies lower than or equal to the predetermined one, while the signal components having frequencies higher than the predetermined one are filtered out. Alternatively stated, the high frequency components in the input signal S11 will be filtered out, so as to improve the signal quality of the signal S2 output to the chip 200. In some embodiments, the predetermined frequency is 24 KHz, so that the signal components of the input signal S11 with frequencies lower than 24 KHz are passed. In some embodiments, the configuration of capacitor C1, resistor R2, and amplifier 116 is related to a predetermined frequency.

In step 330, the signal S2 received from a connection wire is filtered by the signal control circuit 210 used as a filter circuit and the signal S2 is amplified according to the gain value G2 to output the signal S3 to the driver circuit 214. In some embodiments, the filtering of the signal S2 with the signal control circuit 210 as a filter circuit includes operations of low-pass filtering. In some embodiments, the configuration relationship of the resistor R4, the capacitor C2 and the amplifier 216 in the signal control circuit 210 is similar to that of the resistor R2, the capacitor C1 and the amplifier 116 in the filter circuit 114. Therefore, the repetitious descriptions are omitted here.

In some embodiments, the gain value G2 is smaller than the gain value G1. For example, in some embodiments, the gain value G2 is approximately equal to 1.51, so the signal S3 has a voltage swing VS3 between −5 Volts and +5 Volts (i.e., the voltage swing VS2*the gain value G2). Alternatively stated, in the embodiment in which the gain values G1 and G2 are both greater than 1, the signal S3 has the largest voltage swing, and the voltage swing of the signal S2 is larger than the voltage swing of the input signal S11.

In some embodiments, the method 30 of operating an electronic package device further includes outputting the signal S3 through the driver circuit 214 to drive an audio device (not shown).

The configurations of FIG. 3 are provided for illustrative purposes. The various implementations of FIG. 3 are within the category of an embodiment of the present application. For example, in some embodiments, the value of the predetermined frequency and the gain values are not the values described in this specification. Those skilled in the art can adjust the configurations of the filter circuit 114 and the signal control circuit 210 according to the actual implementation of the embodiments of the present application.

Figure 4:
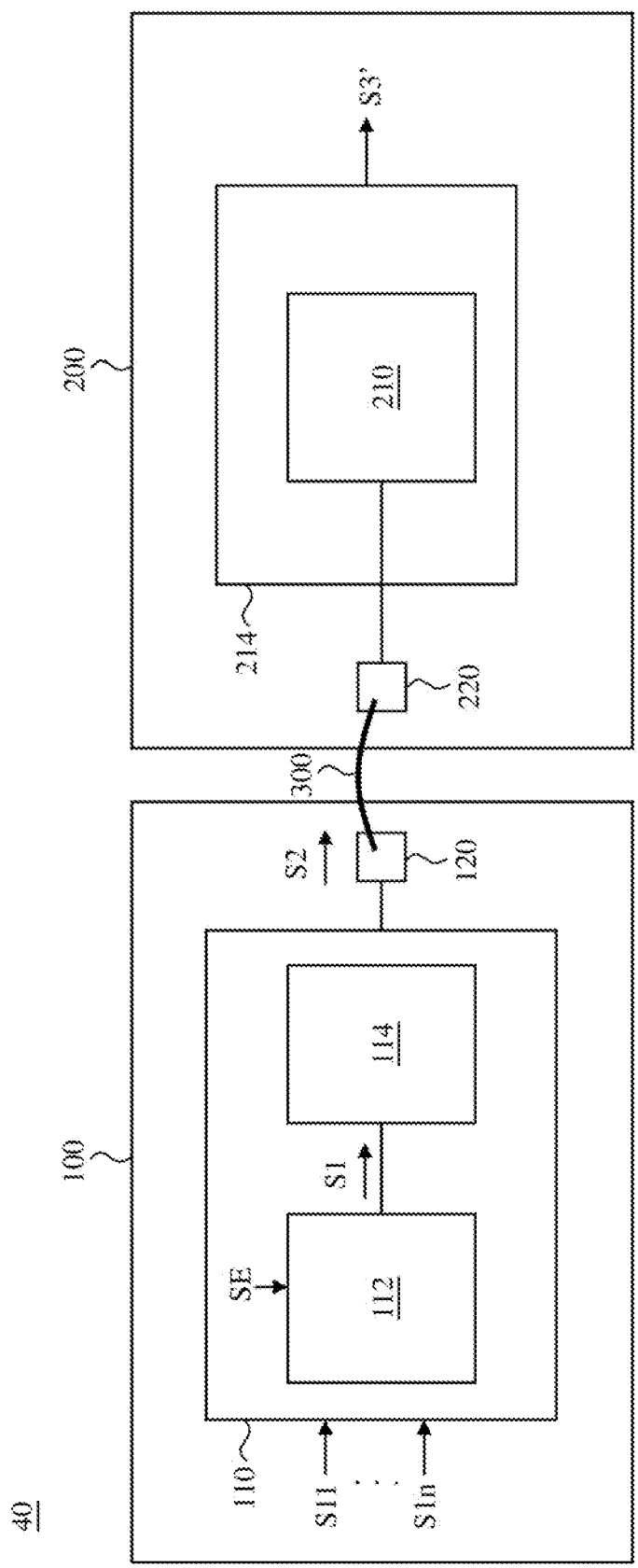
FIG. 4 is a schematic diagram of an electronic packaging device, according to some embodiments of the present application.

Reference is now made to FIG. 4. FIG. 4 is a schematic diagram of an electronic packaging device 40, according to some embodiments of the present application. The electronic packaging device 40 is configured with respect to, for example, the electronic packaging device 10 in FIG. 1. As shown in FIG. 4, compared with FIG. 1, the signal control circuit 210 is included in the driver circuit 214. In some embodiments, the driver circuit 214 is further configured to perform other signal processing operations (such as amplification, filtering, phase modulation, etc.,) on the signal S3 to generate the signal S3' to drive the audio device.

In summary, the present application provides an electronic packaging device and a method of operating the same. Different source signals from the front-end chip in the electronic package are transmitted through a single set of connecting elements, with configured multiplexers and filtering circuits, that operate in response to the selection signal, in the front-end chip (before the target chip) to select, filter and amplify the signals required by the target chip. The device and method provided in this application can not only reduce the noise that could have been generated seriously by the interaction between high-frequency components of the transmitted signals and parasitic inductance and capacitance otherwise, but also simplify the connection wires between chips, thus further saving the area and cost of the transmission element within the package (e.g., conductive pads, connection wires, etc.).

Although the present application has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present application without departing from the scope or spirit of the disclosure. In view of the foregoing, it is intended that the present application covers modifications and variations of this disclosure provided they fall within the scope of the following claims.

What is claimed is:

1. An electronic package device, comprising:
   a first chip having a first conductive pad; and
   a second chip having a second conductive pad coupled to the first conductive pad through a connection wire,
   wherein the first chip comprises:
   a first signal control circuit configured to receive, in response to a selection signal, one of a plurality of input signals as a first signal, filter the first signal, and output the filtered first signal as a second signal from the first conductive pad to the second conductive pad,
   wherein the first signal control circuit is further configured to amplify the first signal, based on a first gain value, to generate the second signal.

2. The electronic package device of claim 1, wherein the second chip comprises:
   a second signal control circuit configured to perform filtering on the second signal and to amplify the second signal, based on a second gain value, to generate a third signal.

3. The electronic package device of claim 2, wherein the first gain value is different from the second gain value.

4. The electronic package device of claim 1, wherein the first signal control circuit comprises:
   a multiplexer configured to receive the plurality of input signals and to output, in response to the selection signal, the first signal; and
   a first filter circuit coupled between the first conductive pad and the multiplexer, and configured to filter the first signal and to amplify, based on the first gain value, the first signal to generate the second signal.

5. The electronic package device of claim 4, further comprising:
   a driver circuit configured to drive, based on a third signal, an audio device,
   wherein the second chip comprises:
   a second filter circuit coupled between the second conductive pad and the driver circuit, and configured to filter the second signal to generate the third signal.

6. The electronic package device of claim 5, wherein the second filter circuit is further configured to amplify, based on a second gain value smaller than the first gain value, the second signal to generate the third signal.

7. The electronic package device of claim 1, wherein the second chip comprises:
a filter circuit coupled between the second conductive pad and a driver circuit, and configured to filter the second signal to generate a third signal to driver circuit.

8. The electronic package device of claim 7, wherein the first signal, the second signal, and the third signal have different voltage swings.

9. A method of operating an electronic package device, comprising:
receiving, by a multiplexer, in response to a selection signal, one of a plurality of input signals as a first signal;
filtering, by a first filter circuit, the first signal, and amplifying, based on a first gain value, the first signal to output a second signal; and
filtering, by a second filter circuit different from the first filter circuit, the second signal received from a connection wire to output a third signal to a driver circuit,
wherein the first gain value is associated with a resistance value of a resistor that is coupled between the multiplexer and an output terminal of the first filter circuit.

10. The method of operating the electronic package device of claim 9, further comprising:
amplifying, by the second filter circuit, based on a second gain value smaller than the first gain value, the second signal to output the third signal.

11. The method of operating the electronic package device of claim 9, further comprising:
amplifying, by the second filter circuit, based on a second gain value different from the first gain value, the second signal to output the third signal.

12. The method of operating the electronic package device of claim 9, further comprising:
outputting, by the driver circuit, the third signal to drive an audio device.

13. The method of operating the electronic package device of claim 9, wherein filtering the first signal by the first filter circuit comprises operations of low-pass filtering, and
filtering the second signal by the second filter circuit comprises operations of low-pass filtering.

14. An integrated circuit, comprises:
a first chip comprising a first signal control circuit configured to selectively amplify, based on a first gain value, one of a plurality of input signals to output a first signal; and
a second chip comprising a second signal control circuit and coupled to the first signal control circuit, wherein the second signal control circuit is configured to perform filtering on the first signal and to amplify, based on a second gain value different from the first gain value, the first signal to output a second signal to a driver circuit,
wherein the first gain value is greater than the second gain value.

15. The integrated circuit of claim 14, wherein the first signal control circuit comprises:
a filter circuit configured to filter the one of the plurality of input signals to generate the first signal.

16. The integrated circuit of claim 14, wherein the first signal control circuit comprises:
a multiplexer configured to receive the plurality of input signals and to output, in response to a selection signal, the one of the plurality of input signals; and
a filter circuit configured to filter the one of the plurality of input signals to output the first signal.

17. The integrated circuit of claim 14, wherein an output terminal of the first signal control circuit is coupled to a first conductive pad in the first chip, and
an input terminal of the second signal control circuit is coupled to a second conductive pad in the second chip,
wherein the first conductive pad is coupled to the second conductive pad through a connection wire.

* * * * *